United States Patent [19]

Okamoto

[11] Patent Number: 4,787,951
[45] Date of Patent: Nov. 29, 1988

[54] METHOD AND APPARATUS FOR ADHERING A TAPE OR SHEET TO A SEMICONDUCTOR WAFER

[75] Inventor: Tadahiro Okamoto, Kawasaki, Japan
[73] Assignee: Fujitsu Limited, Kanagawa, Japan
[21] Appl. No.: 65,548
[22] Filed: Jun. 24, 1987

[30] Foreign Application Priority Data

Jul. 2, 1986 [JP] Japan .................... 61-154110

[51] Int. Cl.⁴ ........................... B32B 31/04
[52] U.S. Cl. ................... 156/285; 100/210; 156/299; 156/312; 156/382; 156/481; 156/555; 156/582
[58] Field of Search ............ 156/285, 299, 312, 382, 156/481, 268, 224, 288, 580, 581, 486–488, 574, 555, 522, 582; 100/156, 210

[56] References Cited

U.S. PATENT DOCUMENTS

| | | | |
|---|---|---|---|
| 2,793,676 | 5/1957 | Hubmeier | 156/462 |
| 2,983,635 | 5/1961 | Richardson | 156/102 |
| 3,322,598 | 5/1967 | Marks et al. | 156/285 |
| 4,026,755 | 5/1977 | Gossie | 156/574 |
| 4,327,634 | 5/1982 | Colmon et al. | 156/582 |

*Primary Examiner*—Michael W. Ball
*Assistant Examiner*—David Herb
*Attorney, Agent, or Firm*—Armstrong, Nikaido, Marmelstein & Kubovcik

[57] ABSTRACT

A method and apparatus for adhering an adhesive-backed tape or sheet to a surface of a semiconductor wafer. The apparatus comprises a housing forming a vacuum working chamber containing a supporting table for the semiconductor wafer and a plurality of rollers for exerting pressure on an adhesive-backed tape or sheet and pressing it against the wafer surface. The rollers comprise rubber rollers having different axial lengths so that, even if the wafer is warped, the tape or sheet can be uniformly adhered to the whole surface of the wafer.

20 Claims, 5 Drawing Sheets

METHOD AND APPARATUS FOR ADHERING A TAPE OR SHEET TO A SEMICONDUCTOR WAFER

BACKGROUND OF THE INVENTION

1. Field of the Invention

This invention relates to the production of semiconductor wafers and, more particularly, to a method and apparatus for adhering an adhesive-backed tape or sheet to a semiconductor wafer.

2. Description of the Related Art

In the production of semiconductor devices, such as integrated circuits (IC), large scale integrated circuits (LSI), and very large scale integrated circuits (VLSI), a disk-like semiconductor wafer is formed with a number of electrical patterns on the surface thereof and then cut into a predetermined number of squares to obtain semiconductor chips for individual devices. Before cutting the wafer, an adhesive-backed tape or sheet is adhered to the back surface of the wafer to prevent cut chips from scattering into individual pieces.

A method for adhering a tape to a wafer is known in the prior art, in which a semiconductor wafer is placed on a supporting table and an adhesive-backed sheet, made of, for example, vinyl chloride tape, is then brought into contact with the wafer surface. Then, the entire surface of the adhesive-backed tape is rolled or brushed with a rubber roller or brush. However, there is a disadvantage with this method because the adhesive-backed sheet does not come into full contact with the wafer at the central portion thereof if the wafer is warped in such a way that the central portion thereof is concave, as shown in FIG. 11.

FIG. 10 shows a known wafer mounting apparatus for adhering an adhesive-backed sheet to a semiconductor wafer, in which reference numeral 51 denotes an upper housing; 52, a lower housing; 53, a rubber roller; 54, a motor; 55, a rail; 56, a frame; 57, an adhesive-backed sheet; and 58, a semiconductor wafer. In this known apparatus, after the pressure in the chamber is reduced by a vacuum pump (not shown) to about $-750$ mmHg, the single roller 53 is lowered to come into contact with the adhesive-backed sheet 57. Then, the roller 53 is moved by the motor 54 along the rail 55 to roll over the back surface of the semiconductor wafer 58 and exert a slight force to press the adhesive-backed sheet 57 against the wafer 58.

However, if the wafer 58 is warped in such a manner that the central portion is lower than the peripheral portion thereof, such as schematically and exaggeratedly shown in FIG. 11, the roller 53 comes into contact only with the peripheral portion of the wafer 58, and not with the central portion thereof. Therefore, an air cavity 60 is created between the adhesive-backed sheet 57 (under the roller 53; not shown) and the wafer 58. In this case, after the mouting of the wafer is completed, air bubbles remain at the central part 58a between the sheet 57 and the wafer 58.

In a subsequent process, the wafer 58 is cut into a number of semiconductor chips. However, if there are air bubbles remaining between the sheet 57 and the wafer 58, as mentioned above, some of the cut chips at the area corresponding to that containing air bubbles are scattered, or other cut chips are damaged. Therefore, it becomes difficult to handle these cut chips.

SUMMARY OF THE INVENTION

An object of the present invention is to provide a method and apparatus for adhering an adhesive-backed sheet to a semiconductor wafer, in which the adhesive-backed sheet can be uniformly adhered to the entire surface of the wafer.

Another object of the present invention is to provide a method and apparatus for adhering an adhesive-backed sheet to a semiconductor wafer, in which air bubbles are prevented from remaining between the adhesive-backed sheet and the wafer, even if the wafer is warped.

In accordance with the present invention, there is provided an apparatus for adhering an adhesive-backed tape or sheet to a semiconductor wafer, comprising a housing defining a vacuum working chamber therein. A table is provided in the vacuum chamber for supporting the semiconductor wafer. A holding device holds a tape or sheet having at least one adhesive surface at a predetermined position in the vacuum chamber, in such a manner that the adhesive surface thereof is located opposite to a surface of the wafer and a predetermined small clearance is maintained therebetween. A roller frame rotatably supports a plurality of rollers which resiliently contact and rollingly move over the tape or sheet, to exert a slight physical pressure on the tape or sheet to press it against the wafer surface, while the roller frame is moved thereover, so that the adhesive-backed tape or sheet is provisionally adhered to the wafer. A regulation device regulates air pressure in the vacuum chamber.

According to another aspect of the present invention, there is provided a method for adhering a tape or sheet to a semiconductor wafer, comprising the following steps of first, placing the semiconductor wafer on a table in a vacuum working chamber in such a manner that only the peripheral portion of the wafer is in contact with the table. Second an adhesive-backed tape or sheet, having at least one adhesive surface, is set at a predetermined position in the chamber, in such a manner that at least one adhesive surface thereof is located opposite to a surface of the semiconductor wafer and a predetermined small clearance is maintained therebetween. Third, the air pressure is reduce in the vacuum working chamber. Fourth slight physical pressure is exerted on the adhesive-backed tape or sheet to press it against the semiconductor wafer, so that the adhesive-backed tape or sheet is provisionally adhered to the wafer surface. The physical pressing operation comprises a plurality of steps as follows, first, pressure is exerted on a small area including a central portion of the wafer surface. Then, pressure is exerted on a larger area. Finally, pressure is exerted over the entire area of the wafer surface. Then the air pressure is increased in the vacuum working chamber to completely adhere the adhesive-backed tape or sheet to the entire surface of the semiconductor wafer due to the change in the pressure.

BRIED DESCRIPTION OF THE DRAWINGS

DESCRIPTION OF THE PREFERRED EMBODIMENTS

Figure 1:
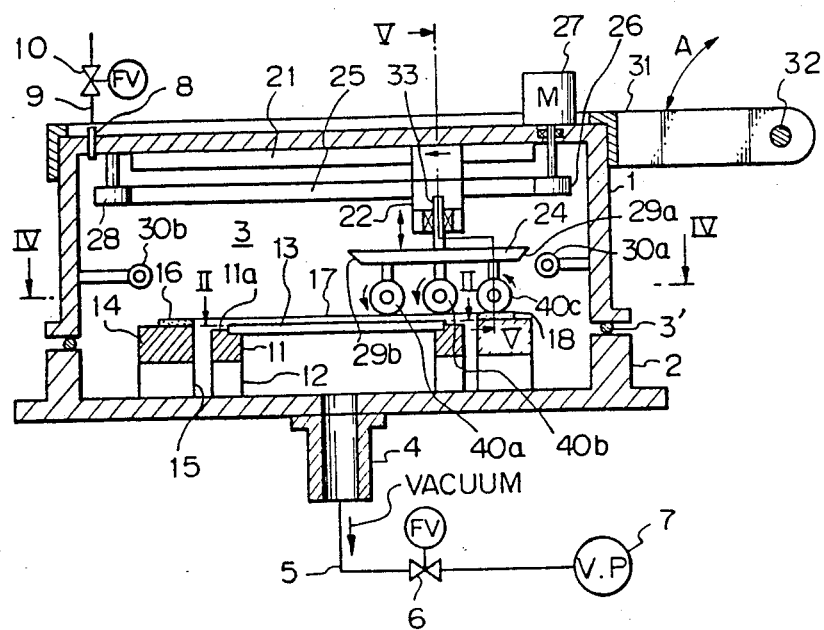
FIG. 1 is a cross-sectional view of an apparatus for adhering an adhesive-backed sheet to a semiconductor wafer according to the present invention.

FIG. 1 shows a semiconductor producing apparatus, especially an apparatus for adhering a tape to a semiconductor wafer according to the present invention, in which an upper housing 1 and a lower housing 2 cooperate to constitute a vacuum chamber 3. An O ring seal 3' is arranged between the abutting faces of the upper and lower housing 1 and 2 to ensure an airtight seal of the chamber 3. The lower chamber 2 is provided with an air outlet 4 connected, via a vacuum line 5 having an air valve 6, to a vacuum pump 7, so that air pressure in the chamber 3 can be reduced to about −750 mmHg. The upper chamber 1 is provided with an air inlet 8 which is open to the atmosphere via an air line 9 having an air valve 10, so that air pressure in the chamber 3 can be increased to atmospheric pressure or a value in the vicinity thereof.

Figure 2:
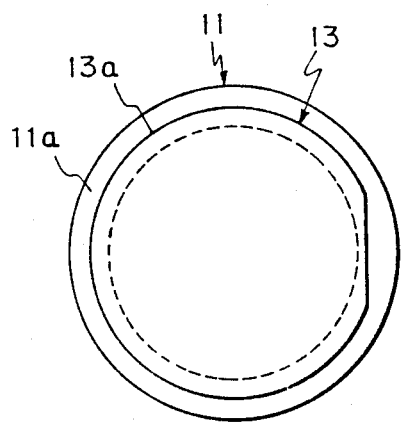
FIG. 2 is a view taken along the line II—II in FIG. 1.

A cylindrical supporting table 11 horizontally arranged on legs 12 is provided in the lower housing 2. The table 11 has a circular-shaped supporting top surface 11a, as seen from FIG. 2, on which a substantially disk-shaped semiconductor wafer 13 (FIG. 3) is horizonatally placed so that the peripheral edge 13a thereof is in contact with the supporting surface 11a of the table 11. A tape-mounting jig 14 is also arranged in the lower housing 2 on legs 15, outside the periphery of the table 11. The tape mounting jig 14 is used to fixedly secure a sheet adhering unit 16 by any conventionally known means (not shown). The sheet adhering unit 16 comprises, as shown in FIG. 4, a thin adhesive-backed sheet 17, made of, for example, a vinyl chloride tape, and having a resin adhesive surface on one surface, and a mounting frame 18 for securing the adhesive-backed sheet 17 by the peripheral edge thereof.

The inner wall of the upper housing 1 is provided with a horizontal guide rail 21 along which a roller base 22 is movably supported. The roller base 22 is connected to a drive belt 25 which extends between a drive pulley 26 attached to an output shaft of a drive motor 27 mounted on the upper housing 1 and an idle pulley 28 rotatably mounted on the upper housing 1, so that the roller base 22 can be moved by the motor 27 in the horizontal direction by a predetermined stroke along the guide rail 21.

According to the present invention, a plurality of rollers (for example three rollers 40a, 40b, and 40c) having different axial lengths are supported on a roller frame 24 and arranged in parallel to each other. In this embodiment, as shown in FIG. 4, the front roller 40a having the shortest axial length is arranged at the center. The rear roller 40c has the longest axial length, and this length is slightly larger than the diameter of the semiconductor wafer 13.

Figure 5:
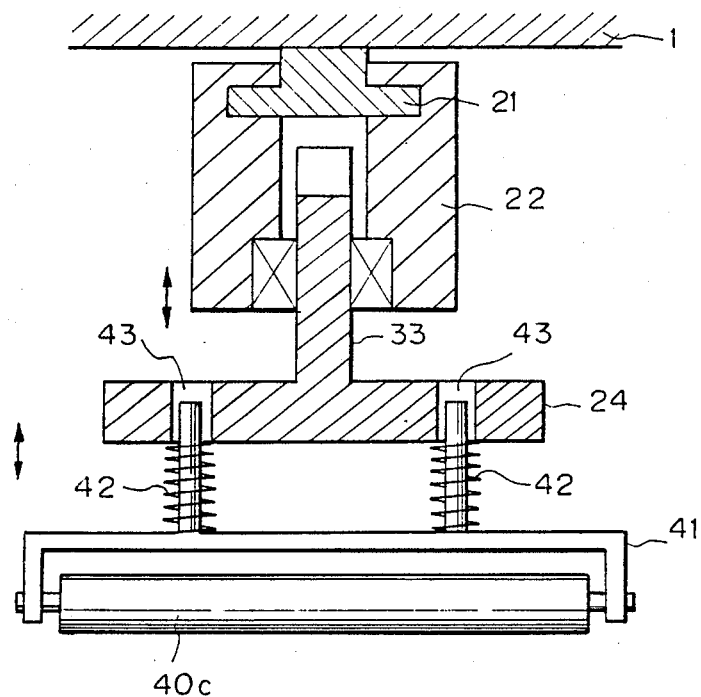
FIG. 5 is an enlarged cross-sectional view taken along the line V—V in FIG. 1.

Each of the rollers 40a, 40b, and 40c made of, for example, silicon rubber, is rotatably mounted on an individual support member 41 which is suspended by the roller frame 24 in such a manner that each roller 40a, 40b, or 40c is vertically movable, within a predetermined range, independently of the other rollers, by springs 42 and guide members 43, as shown in FIG. 5. The roller frame 24 is provided with a vertical shaft 33 which is also vertically movably supported on the roller base 22.

The roller frame 24 has a pair of cam members 29a and 29b which engage with a pair of rollers 30a and 30b, respectively, rotatably mounted on the side walls of the upper chamber 1, so that the roller frame 24 is raised, and accordingly, the rollers 40a, 40b, and 40c are also raised and separated from the adhesive-backed sheet 17 at the respective ends of the stroke of the roller base 22.

The upper housing 1 is rigidly secured to an arm 31 which is pivotably moved, in the directions shown by an arrow A, about a shaft 32 connected to a machine base (now shown) by any suitable means known in the prior art, so that the chamber 3 can be opened by lifting the upper housing 1 to separate it from the lower housing 2.

The steps of adhering the tape or sheet 17 to the semiconductor wafer 13 will now be described. First, the chamber 3 is opened by lifting the upper housing 1 and separating it from the lower housing 2. A disk-like semiconductor wafer 13 (FIG. 3) having electrical patterns already formed on the front surface thereof is placed on the cylindrical table 11 in such a manner that the back surface of the wafer 13 faces upward. In this state, the major central part of the front surface of the semiconductor wafer 13 on which the above mentioned electrical patterns are formed is not in contact with the upper supporting face 11a of the cylindrical table 11.

Then, the sheet adhering unit 16 is fixedly set on the tape-mounting jig 14 so that the adhesive side of the adhesive-backed sheet 17 faces downward and a small clearance, for example, 0.1 to 0.2 mm, is maintained between the sheet 17 and the back surface of the wafer 13. The upper housing 1 is then lowered and the chamber 3 is closed, as mentioned above, and air pressure in the chamber 3 is reduced by the vacuum pump 7 to about −750 mmHg.

At an initial stage, the roller base 22 is located on the right in FIG. 1, in which the roller frame 24 is raised by the cam member 29a thereof and the fixed guide roller 30a, so that the rollers 40a, 40b, or 40c are not in contact with the sheet 17. When the above-mentioned vacuum is established, the motor 27 is driven to move the roller base 22 to the left in FIG. 1, along the guide rail 21. After the cam member 29a moves away from the guide roller 30a, the roller frame 24 is lowered and, therefore, the rollers 40a, 40b, and 40c are allowed to roll over the back surface of the semiconductor wafer 13 in turn, and slightly press the adhesive-backed sheet 17 against the wafer 13 by a pressure substantially equal to that exerted on the rollers 40a, 40b, and 40c by the force of gravity, i.e., about 200 to 300 g.

While the rollers 40a, 40b, and 40c move to the left in FIG. 1 (downward in FIG. 4), first the front roller 40a presses the adhesive-backed sheet 17 against the wafer 13 along a diametrical line of the wafer 13, then the intermediate and rear rollers 40b and 40c, in turn, press the sheet 17 against the wafer 13. As is clear from the Figures, the longest axial length roller 40a covers the entire area of the wafer 13.

Figure 6:
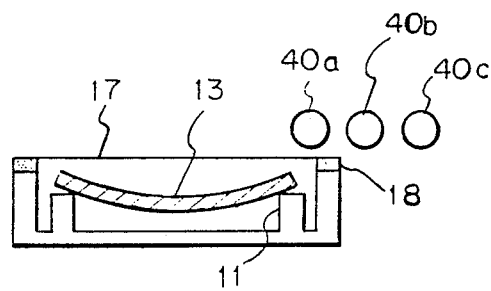
FIG. 6 is a schematic illustration showing the relationship between the wafer and rollers which are in their initial positions.
Figure 7:
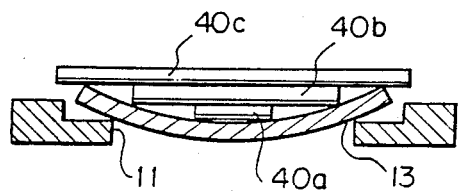
FIG. 7 is a schematic illustration showing the operation of the rollers according to the present invention.
Figure 10:
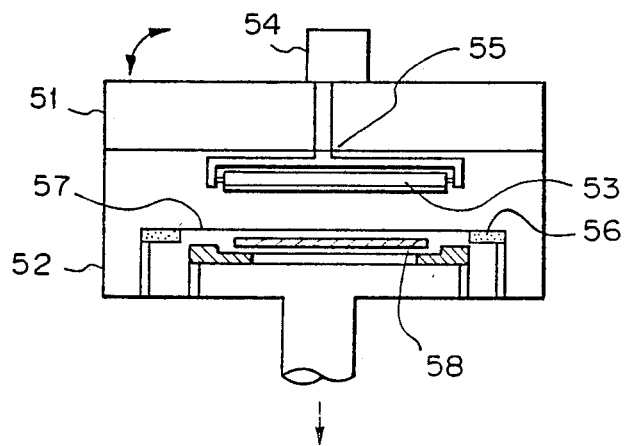
FIG. 10 is a schematic cross-sectional view of a known wafer mounting apparatus; and, FIG. 11 is a schematic illustration showing the operation of the known apparatus, as shown in FIG. 10.
Figure 11:
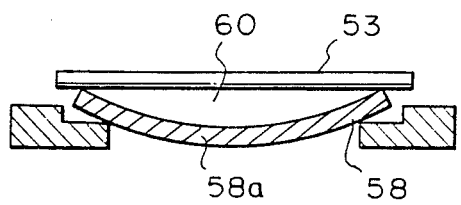

Since these rollers 40a, 40b, and 40c act on the wafer 13 independently of each other, even if the wafer 13 is warped, such as exaggeratedly shown in FIG. 6, the front roller 40a first comes into contact with the central portion of the wafer 13, as shown in FIG. 7. Therefore, the adhesive-backed sheet 17 will have been forced comes into contact with the entire surface (back face) of the wafer 13, by the time the roller base 22 arrives at a position on the left in FIG. 1. For simplicity, the sheet 17 is omitted from FIG. 7.

At the end of the stroke, the roller frame 24 is again raised by the cam member 29b and the fixed guide roller 30b, so that the rollers 40a, 40b, or 40c are separated from the adhesive backed sheet 17. Then, the air valve 10 is opened to introduce atmospheric air into the chamber 3 so that the pressure in the chamber 3 becomes equal to the atmospheric pressure or a value in the vicinity thereof. Due to this pressure increase, the thin adhesive-backed sheet 17 is drawn against the semiconductor wafer 13 and thus completely adhered to the entire back surface thereof. Therefore, a uniform, stable adhesion between the sheet 17 and the wafer 13 is established and air bubbles are not formed therebetween. Then the upper housing 1 is raised to open the chamber 3, and the sheet adhering unit 16 is removed together with the semiconductor wafer 13 adhered thereto.

Figure 3:
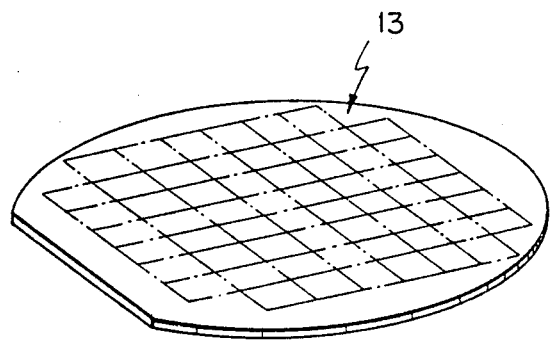
FIG. 3 is a perspective view of a semiconductor wafer.
Figure 4:
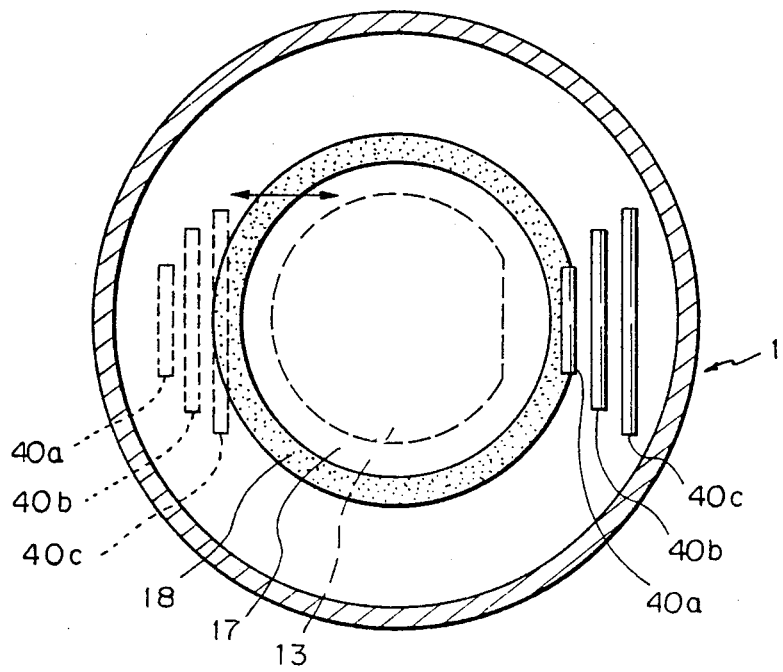
FIG. 4 is a cross-sectional view taken along the line IV—IV in FIG. 1.

The semiconductor wafer 13 is then cut along a plurality of dotted lines, as seen in FIG. 3, into a number of square-shaped semiconductor chips for individual devices, by a so-called dicing process. During this process, the individual cut pieces are prevented from scattering into individual pieces, as a uniform and stable adhesion without air bubbles is maintained between the wafer 13 and adhesive-backed sheet 17. As is obvious, the surface of the wafer 13 is not damaged, since no unfavorable external force is applied to the front surface of the semiconductor wafer 13 during the adhering operation. Each of the cut individual semiconductor chips are used, as mentioned previously, for producing semiconductor devices, such as integrated circuits (IC), large scale integrated circuits (LSI), or very large scale integrated circuits (VLSI).

Figure 8:
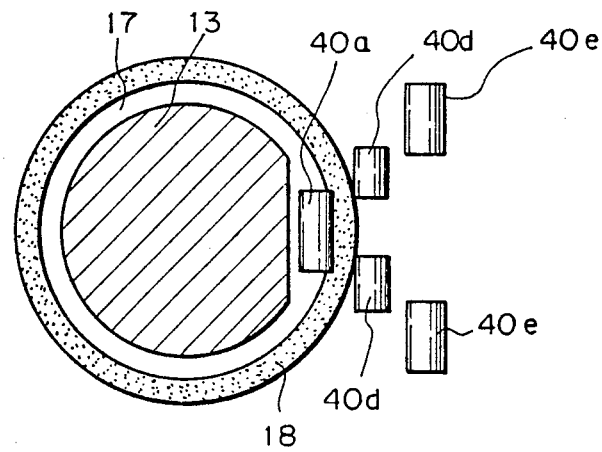
FIGS. 8 and 9 are schematic illustrations showing other embodiments of roller arrangements.
Figure 9:
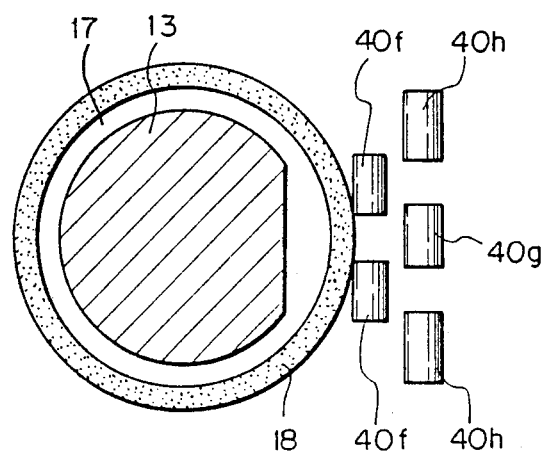

FIGS. 8 and 9 illustrate other embodiments of roller arrangements, in which a plurality of same-sized rollers are used. In FIG. 8, two intermediate rollers 40d are separated by a distance slightly smaller than the axial length of the front roller 40a, and two rear rollers 40e are also separated, so that the entire area of the wafer 13 is covered by all of the five rollers 40a, 40d, and 40e.

In FIG. 9, two front rollers 40f and three rear rollers including a central roller 40g and two side rollers 40h are arranged so that the entire area of the wafer 13 is covered by all of the five rollers 40f, 40g, and 40h, in the same manner as the above embodiment shown in FIG. 8. In this case, however, preferably the central roller 40g is supported independently of the two side rollers 40h.

In still other embodiments, a plurality of brushes can be used in place of the above mentioned plurality of rollers. In this case, the brushes can be arranged and supported in the same manner as mentioned above in relation to the rollers.

What is claimed is:

1. A method for adhering a tape or sheet to a semiconductor wafer, comprising the following steps of:
   placing said semiconductor wafer on a table in a vacuum working chamber in such a manner that only the peripheral portion of said wafer is in contact with said table;
   setting an adhesive-backed tape or sheet having at least one adhesive surface at a predetermined position in said chamber, in such a manner that the at least one adhesive surface thereof is located opposite a surface of said semiconductor wafer and a predetermined small clearance is maintained therebetween;
   reducing an air pressure in said vacuum working chamber;
   exerting a slight physical pressure on said adhesive-backed tape or sheet to the entire surface of said against said semiconductor wafer, so that said adhesive-backed tape or sheet is provisionally adhered to the wafer surface by rollingly moving a plurality of rubber rollers over said adhesive-backed tape or sheet, said rollers having different axial lengths from each other; said physical pressure-exerting process comprising a plurality of steps, as follows, first exerting pressure on a small area including a central portion of the wafer surface by rollingly moving a shortest axial length roller along a diametrical line of the wafer, then exerting pressure on a larger areaby rollingly moving a longer axial length roller thereover, and finally, exerting pressure over an entire area of the wafer surface by rollingly moving a longest axial length roller thereover; and,
   increasing the air pressure in said vacuum working chamber to completely adhere said adhesive-backed tape or sheet to the entire suface of said semiconductor wafer due to the change in said pressure.

2. A method as set forth in claim 1, wherein said small clearance between said adhesive-backed tape or sheet and said semiconductor wafer is 0.1 to 0.2 mm.

3. A method as set forth in claim 1, wherein the air pressure in said vacuum working chamber is reduced by a vacuum pump to −750 mmHg or less and increased by introducing atmospheric pressure therein.

4. A method as set forth in claim 1, further comprising the step of vertically moving each of said contact means independently of the other contact means.

5. An apparatus for adhering an adhesive-backed tape or sheet to a semiconductor wafer, comprising:
   a housing means defining a vacuum working chamber therein:
   a table provided in said vacuum chamber for supporting said semiconductor wafer;
   holding means for holding said tape or sheet, having at least one adhesive surface, at a predetermined position in said vacuum chamber, in such a manner that said adhesive surface thereof is located oppostie to a surface of said wafer and a predetermined small clearance is maintained therebetween;
   a roller frame for rotatably supporting a plurality of rollers which resiliently contact and rollingly move over said tape or sheet to exert a slight physical pressure on said tape or sheet and thereby press said tape or sheet against the wafer, while said roller frame is moved thereover, so that said adhesive-backed tape or sheet is provisionally adhered to the wafer, wherein said plurality of rollers having different axial lengths from and are arranged in parallel to each other on said roller frame, rollers having the shortest and longest axial lengths are arranged at frontmost and rearmost positions, respectively, with respect to the direction in which the roller frame is moved over the wafer, and said shortest axial length roller is moved to cover an area along a diametrical line of the wafer surface and said longest axial length roller is moved to cover the entire area of the wafer surface; and, regulation means for regulating an air pressure in said vacuum chamber.

6. An apparatus as set forth in claim 5, wherein each of said plurality of rollers comprises a rubber roller which is resiliently supported on said roller frame by means of a spring.

7. An apparatus as set forth in claim 6, wherein said roller frame is vertically movably supported on a roller base, said roller base is, in turn, horizontally moved along a guide rail within a predetermined stroke.

8. An apparatus as set forth in claim 7, wherein said roller frame is provided with a pair of cam members which engage with a pair of rolls, respectively, situated in said housing, so that said roller frame is raised and separated from said adhesive-backed sheet, when said roller frame reaches the respective ends of the stroke thereof.

9. An apparatus as set forth in claim 5, wherein each of said plurality of rollers is vertically movable independently of the other rollers.

10. An apparatus for adhering an adhesive-backed tape or sheet to a semiconductor wafer, comprising:
a housing means defining a vacuum working chamber therein;
a table provided in said vacuum chamber for supporting said semiconductor wafer;
holding means for holding said tape or sheet, having at least one adhesive surface, at a predetermined position in said vacuum chamber, in such a manner that the adhesive surface thereof is located opposite to a surface of said wafer and a predetermined small clearance is maintained therebetween;
pressure-exerting means for exerting a slight physical pressure on said tape or sheet to press said tape or sheet against the wafer, said pressure-exerting means comprising a plurality of contact means which are independently in contact with and press against the adhesive-backed tape or sheet while said contact means are moved thereover, so that the adhesive-backed tape or sheet is provisionally adhered to the wafer, wherein said plurality of contact means have different widths, so that a shortest width contact means covers an area along a diametrical line of the wafer surface and a longest width contact means covers the entire area of the wafer surface;
moving means for moving said contact means in such a manner that said contact means are moved over a surface of the wafer; and,
regulating means for regulating an air pressure in said vacuum chamber.

11. An apparatus as set forth in claim 10, wherein said semiconductor wafer is substantially disk-shaped and said table comprises a cylindrical supporting section, on which said semiconductor wafer is horizontally placed in such a manner that only the peripheral edge of the front surface of said wafer is in contact with said table.

12. An apparatus as set forth in claim 10, wherein said semiconductor wafer is substantially disk-shaped and said table comprises a cylindrical supporting section, on which said semiconductor wafer is horizontally placed in such a manner that only the peripheral edge of the front surface of said wafer is in contact with said table.

13. An apparatus as set forth in claim 10, wherein said plurality of contact means including front, intermediate and rear contact means, at least two intermediate contact means being separated by a distance slightly larger than an axial length of the front contact means in front of said intermediate contact means, at least two rear contact means being separated so that an entire area of the wafer is covered by all of the plurality of contact means.

14. An apparatus as set forth in claim 10, wherein said plurality of contact means includes two front contact means and three rear contact means, said rear contact means including a central contact means and two side contact means, said contact means being arranged so that the entire area of the wafer is covered by all of said contact means, and wherein a distance separating any two of said three rear contact means is a distance slightly smaller than an axial length of said front contact means in front of said rear contact means.

15. An apparatus according to claim 10, wherein each of said plurality of contact means is vertically movable independently of the other contact means.

16. An apparatus for adhering an adhesive-backed tape or sheet to a semiconductor wafer, comprising:
a housing means defining a vacuum working chamber therein;
a table provided in said vacuum chamber for supporting said semiconductor wafer;
holding means for holding said tape or sheet, having at least one adhesive surface, at a predetermined position in said vacuum chamber, in such a manner that the adhesive surface thereof is located opposite to a surface of said wafer and a predetermined small clearance is maintained therebetween;
pressure-exerting means for exerting a slight physical pressure on said tape or sheet to press said tape or sheet against the wafer, said pressure-exerting means comprising a plurality of contact means which are independently in contact with and press against the adhesive-backed tape or sheet while said contact means are moved thereover, so that the adhesive-backed tape or sheet is provisionally adhered to the wafer, said plurality of contact means having different contact widths so that a shortest width contact means covers a relatively small area along a diametrical line of the wafer surface and a longest width contact means covers a relatively wide area of the wafer so as to cover the entire area thereof;
moving means for moving said contact means in such a manner that said contact means are moved over a surface of the wafer; and,
regulating means for regulating an air pressure in said vacuum chamber.

17. An apparatus as set forth in claim 16, wherein said semiconductor wafer is substantially disk-shaped and said table comprises a cylindrical supporting section, on which said semiconductor wafer is horizontally placed in such a manner that only the peripheral edge of the front surface of said wafer is in contact with said table.

18. An apparatus as set forth in claim 16, wherein said plurality of contact means including front, intermediate and rear contact means, at least two intermediate contact means being separated by a distance slightly larger than an axial length of the front contact means in front of said intermediate contact means, at least two rear contact means being separated so that an entire area of the wafer is covered by all of the plurality of contact means.

19. An apparatus as set forth in claim 16, wherein said plurality of contact means includes two front contact means and three rear contact means, said rear contact means including a central contact means and two side contact means, said contact means being arranged so that the entire area of the wafer is covered by all of said contact means, and wherein a distance separating any two of said three rear contact means is a distance slightly smaller than an axial length of said front contact means in front of said rear contact means.

20. An apparatus according to claim 16, wherein each of said plurality of contact means is vertically movable independently of the other contact means.

* * * * *